(12) United States Patent
Park et al.

(10) Patent No.: US 9,093,525 B2
(45) Date of Patent: Jul. 28, 2015

(54) MULTI-GATE TRANSISTOR

(75) Inventors: Jong Hoon Park, Incheon (KR); Chang Kun Park, Gyeonggi-do (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 14/352,318

(22) PCT Filed: Mar. 22, 2012

(86) PCT No.: PCT/KR2012/002079
§ 371 (c)(1),
(2), (4) Date: Apr. 17, 2014

(87) PCT Pub. No.: WO2013/062187
PCT Pub. Date: May 2, 2013

(65) Prior Publication Data
US 2014/0264627 A1    Sep. 18, 2014

(30) Foreign Application Priority Data
Oct. 24, 2011  (KR) .................. 10-2011-0108789

(51) Int. Cl.
*H01L 29/78*   (2006.01)
*H01L 29/423*  (2006.01)
*H01L 29/06*   (2006.01)
*H01L 29/10*   (2006.01)
*H01L 27/088*  (2006.01)

(52) U.S. Cl.
CPC .......... *H01L 29/7831* (2013.01); *H01L 27/088* (2013.01); *H01L 29/0692* (2013.01); *H01L 29/1033* (2013.01); *H01L 29/4238* (2013.01); *H01L 29/7838* (2013.01)

(58) Field of Classification Search
CPC ............ H01L 29/7831; H01L 29/4238; H01L 29/7838; H01L 29/0692; H01L 29/1033; H01L 27/088
See application file for complete search history.

(56) References Cited

U.S. PATENT DOCUMENTS

| 5,719,429 | A |  | 2/1998 | Yoshida et al. |
| 5,874,764 | A | * | 2/1999 | Hsieh et al. .................. 257/401 |
| 6,376,886 | B2 | * | 4/2002 | Mizuhara ..................... 257/386 |
| 7,560,346 | B2 |  | 7/2009 | Igarashi |
| 2008/0203444 | A1 | * | 8/2008 | Kim et al. ..................... 257/270 |

FOREIGN PATENT DOCUMENTS

| EP | 0507077 A2 | 10/1992 |
| JP | 2007-273918 A | 10/2007 |
| KR | 10-1992-0018932 A | 10/1992 |
| KR | 10-1996-0026768 A | 7/1996 |
| KR | 10-2008-0079377 A | 9/2008 |

* cited by examiner

Primary Examiner — Long Pham
(74) Attorney, Agent, or Firm — Revolution IP, PLLC

(57) ABSTRACT

Disclosed is a multi-gate transistor which includes a plurality of gates that is branched from one port, that is alternately formed to face each other, and in which currents flow in the adjacent gates in an opposite direction to each other; a source that is formed on one side or the other side of each of the plurality of gates; and a drain that is formed on the other side or the one side of each of the plurality of gates.

10 Claims, 5 Drawing Sheets

MULTI-GATE TRANSISTOR

CROSS REFERENCE TO PRIOR APPLICATIONS

This application is a National Stage Application of PCT International Patent Application No. PCT/KR2012/002079 filed on Mar. 22, 2012, under 35 U.S.C. §371, which claims priority to Korean Patent Application No. 10-2011-0108789 filed on Oct. 24, 2011, which are all hereby incorporated by reference in their entirety.

TECHNICAL FIELD

The present invention relates to a multi-gate transistor, and more particularly, to a technology in which mutual inductance induced between a plurality of gates is reduced.

BACKGROUND ART

A transistor is a component that is necessarily used in an electronic circuit. Further, as electronic circuits used in various compact electronic devices such as smartphones are miniaturized, various technologies in which a size of the transistor is decreased to improve performance thereof have been developed. When voltage is applied to a gate of the transistor, since a channel is formed between a drain and a source to allow electric charges to move, current is allowed to flow. In this case, when the electric charges pass from the drain to the source to pass through the chanel, power loss is induced by a resistance component of the chanel. In order to increase efficiency and an operation speed of the circuit and to reduce power consumed in the transistor, a research in which a length of the chanel of the transistor is decreased to reduce the resistance component has been conducted.

Further, a multi-gate transistor formed by connecting a plurality of transistors in series or a multi-transistor called a multi-finger transistor has been developed. Such a transistor is configured such that drains and sources are alternately formed between the plurality of gates, and is illustrated in FIG. 1. FIG. 1 is a configuration diagram of a multi-gate transistor according to the related art. Referring to FIG. 1, a multi-gate transistor 100 according to the related art is configured such that sources 130 and drains 140 are formed between a plurality of gates 120 formed on a substrate 110. In this case, the source 130 and the drain 140 are connected to each other by an electric wiring, and the plurality of gates 120 are branched from on port 150 to allow currents to flow through the gates 120. Furthermore, currents flow in the gates 120 in an opposite direction to each other, and currents flow in the adjacent gates 120 in the same direction to cause mutual inductance.

When the currents flow in the multi-gate transistor, if the mutual inductance is induced between the adjacent gates, transmission of a signal may be disturbed, and imbalance of the chanel formed by the gates may be intensified. As an operating frequency is increased, since influence of a parasitic inductance is more increased than that of a parasitic resistance component, such a problem may be intensified. Moreover, since a research on a transistor having a terahertz frequency has been recently conducted, there is a need for development of a technology for solving the parasitic inductance.

DISCLOSURE

Technical Problem

An object of the present invention is to provide a multi-gate transistor capable of minimizing parasitic inductances induced in a transistor.

Technical Solution

An exemplary embodiment of the present invention provides a multi-gate transistor including a plurality of gates that is branched from one port, that is alternately formed to face each other, and in which currents flow in the adjacent gates in an opposite direction to each other; a source that is formed on one side or the other side of each of the plurality of gates; and a drain that is formed on the other side or the one side of each of the plurality of gates.

Further, the plurality of gates may include one or more first-direction gates that are formed to allow currents to flow in a first direction; and one or more second-direction gates that are formed to allow currents to flow in a second direction opposite to the first direction.

Furthermore, the first-direction gate and the second-direction gate may be formed to be spaced apart from each other Moreover, the adjacent gates may share the source or the drain.

In addition, the multi-gate transistor may further include a first transistor that includes a first source formed on one side of each of the plurality of gates and a first drain formed on the other side thereof; and a second transistor that includes a second drain formed on one side of the gate to face the first source and a second source formed on the other side of the gate to face the first drain.

Furthermore, a current direction of the first transistor and a current direction of the second transistor may be opposite to each other.

In addition, the first source and the second drain may be formed to be spaced apart from each other, and the first drain and the second source may be formed to be spaced apart from each other.

Advantageous Effects

According to an embodiment of the present invention, in transistors constituting a multi-gate transistor, directions of currents flowing in gates adjacent to each other are opposite to each other to cause mutual inductances, so that it is possible to minimize parasitic inductance components. Further, since the arrangement of a plurality of drains and the arrangement of a plurality of sources constituting the multi-gate transistor are opposite to each other, directions of currents flowing in the drain and source are opposite to each other to cause mutual inductances, it is possible to minimize the

BEST MODE

Hereinafter, embodiments of the present invention will be described in detail with reference to the accompanying drawings. The terminologies used herein are selected in consideration of functions in the embodiments, and meanings of the terminologies may vary depending on an intention of a user or an operator, or a precedent. Accordingly, when the meanings of the terminologies are specifically defined in the present specification, the meanings of the terminologies used in the following embodiments are used as the defined meanings, and when the meanings of the terminologies are not specifically defined, the meanings of the terminologies are used as meanings which can be in common understood by those having ordinary skill in the art.

Figure 1:
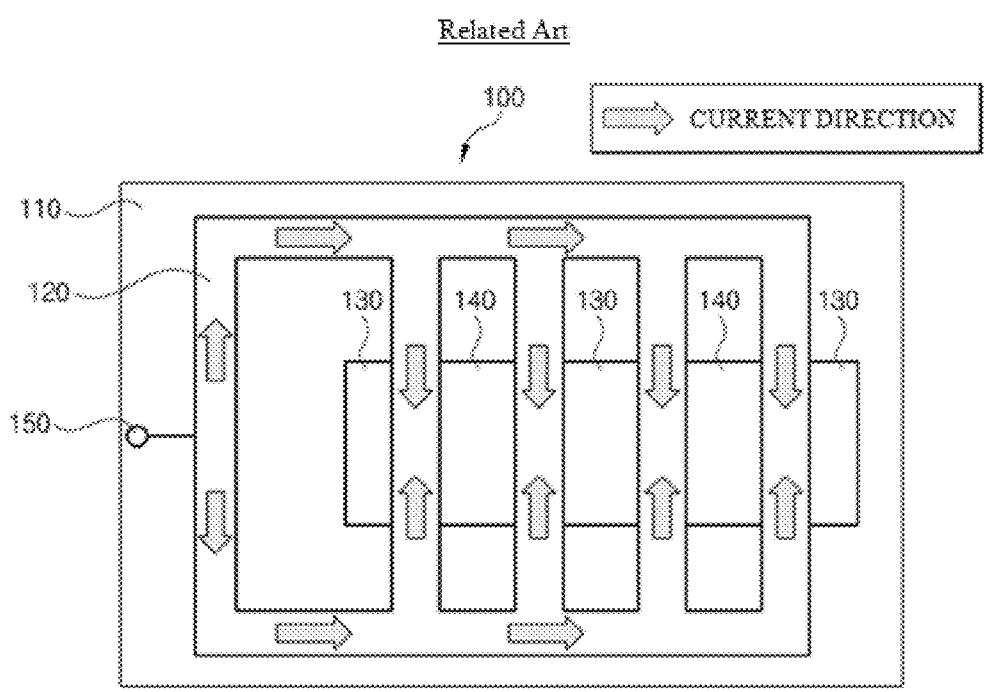
FIG. 1 is a configuration diagram of a multi-gate transistor according to the related art.
Figure 2:
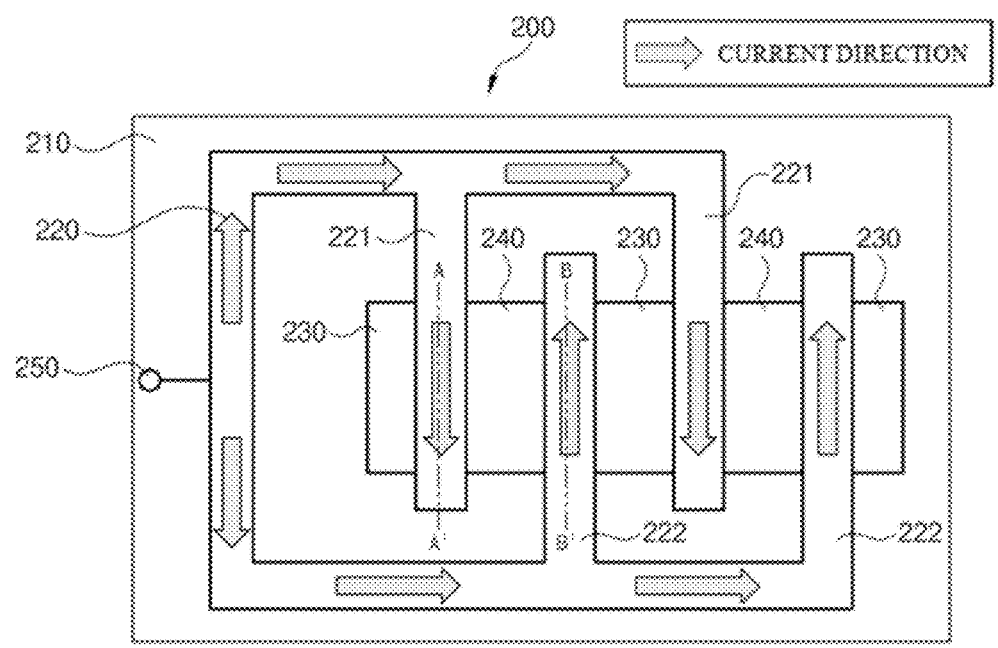
FIG. 2 is a configuration diagram of a multi-gate transistor according to an embodiment of the present invention.

FIG. 2 is a configuration diagram of a multi-gate transistor according to an embodiment of the present invention.

Referring to FIG. 2, a multi-grate transistor 200 includes a plurality of gates 220, sources 230, and drains 240. The plurality of gates 220 are branched from one port 250, and are alternately formed to face each other. In this case, currents flow in the adjacent gates 220 in an opposite direction to each other. Further, the source region 230 is formed on one side or the other side of each of the plurality of gates 220, and the drain region 240 is formed on one side or the other side of each of the plurality of gates 220. In this case, the adjacent gates 220 share the source 230 or the drain 240. A source electrode (not illustrated) and a drain electrode (not illustrated) may be respectively connected to the source 230 and the drain 240 of the multi-gate transistor 200. For example, when the multi-gate transistor 200 is a n-type transistor, electric charges move from the source 230 to the drain 240 by voltage applied between the source electrode and the drain electrode, and current flows from the drain 240 to the source 230 in a direction opposite to the electric charges. When the multi-gate transistor 200 is a p-type transistor, current flows from the source 230 to the drain 240.

Moreover, the plurality of gates 220 includes first-direction gates 221 and second-direction gates 222. The first-direction gates 221 and the second-direction gates 222 are branched from the one port 250 and are regions corresponding to ends of the plurality of gates 220. That is, the plurality of gates 220 is configured such that the first-direction gates 221 and the second-direction gates 222 are formed to be alternately spaced apart from each other between the sources 230 and the drains 240 to supply the currents. In this case, the currents flow in the first-direction gate 221 and the second-direction gate 222 that are adjacent to each other in the opposite direction to each other. For example, when the multi-gate transistor 200 includes a first gate, a second gate, a third gate, and a fourth gate, the first gate and the third gate are the first-direction gates 221, and the second gate and the fourth gate are the second-direction gates 222. A direction of the currents flowing in the first gate and the third gate and a direction of the currents flowing the second gate positioned between the first gate and the third gate and the fourth gate are opposite to each other. Accordingly, the currents flow in the first-direction gates 221 and the second-direction gates 222 in the opposite direction, so that mutual inductance is induced between the adjacent gates 220. A detailed description thereof will be described below with reference to FIG. 3.

Figure 3:
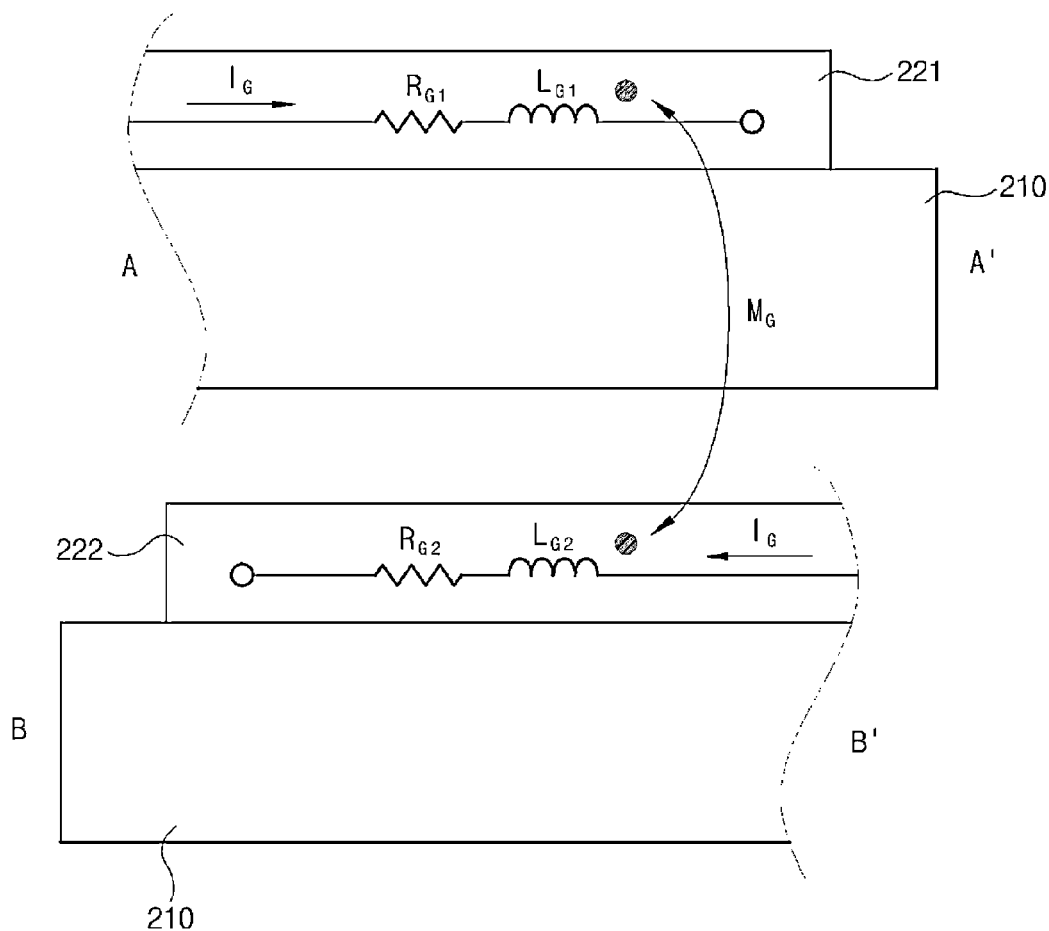
FIG. 3 is a cross-sectional view of the multi-gate transistor of FIG. 2.

FIG. 3 is a cross-sectional view of the multi-gate transistor of FIG. 2.

Referring to FIG. 3, any one of the adjacent gates 220 formed on the substrate 210 is the first-direction gate 221, and the other one is the second-direction gate 222. The source 230 is formed on one side of the first-direction gate 221, and the drain 240 is formed on the other side thereof. In addition, the drain 240 is formed on one side of the second-direction gate 222, and the source 230 is formed on the other side thereof. Accordingly, the adjacent gates 221 and 222 share the source 230 or the drain 240.

Meanwhile, when the currents are supplied to the gates 220 from the port 250 and the currents are supplied to the sources 230 and the drains 240, the multi-gate transistor 200 is operated. Since ends of the first-direction gate 221 and the second-direction gate 222 are opened, the currents do not continuously flow. However, when voltage is applied to the port 250 at an initial stage, a gate current $I_G$ flows due to movement of the electric charges. In this case, the first-direction gate 221 may be represented by a gate resistance $R_{G1}$ and a gate parasitic inductance $L_{G1}$, and the second-direction gate 222 may be represented by a gate resistance $R_{G2}$ and a gate parasitic inductance $L_{G2}$. Since the currents flow in the first-direction gate 221 and the second-direction gate 222 in the opposite direction to each other, a mutual inductance $M_G$ is induced. Accordingly, since the gate parasitic inductance $L_{G1}$ of the first-direction gate 221 and the gate parasitic inductance $L_{G2}$ of the second-direction gate 222 are offset by the mutual inductance $M_G$, it is possible to minimize the parasitic inductances $L_{G1}$ and $L_{G2}$.

Figure 4:
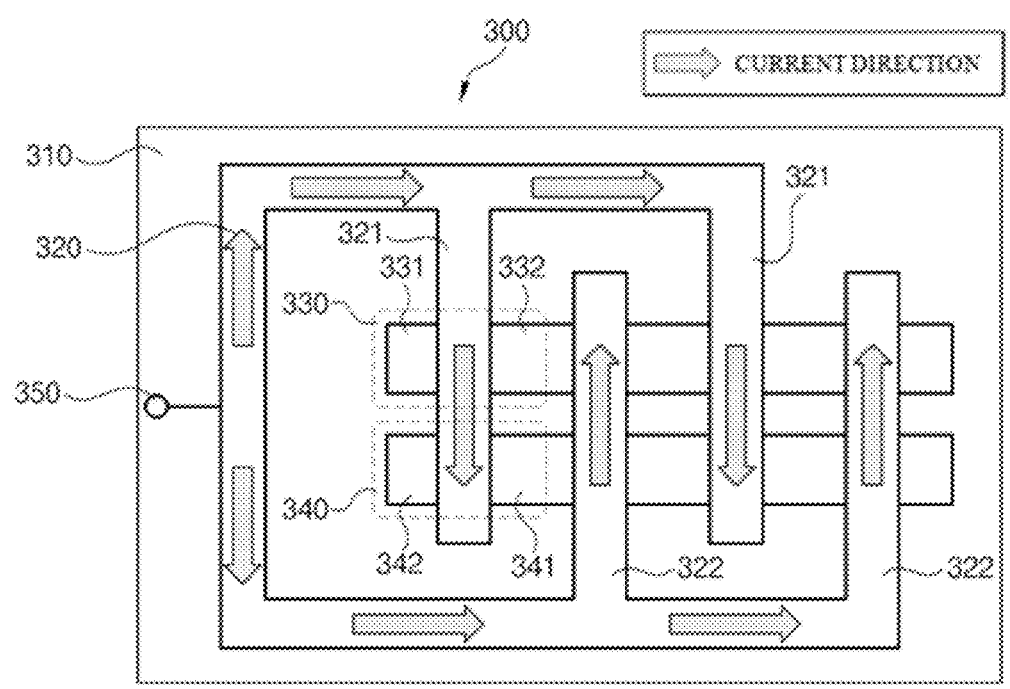
FIG. 4 is a configuration diagram of a multi-gate transistor according to another embodiment of the present invention.

FIG. 4 is a configuration diagram of a multi-gate transistor according to another embodiment of the present invention.

Referring to FIG. 4, a multi-gate transistor 300 includes first transistors 330, and second transistors 340. In this case, the first transistor 330 and the second transistor 340 are formed on one substrate 310, and share one gate 320. The gate 320 includes a first-direction gate 321 and a second-direction gate 322. Specifically, the first transistor 330 includes the gate 320, a first source 331, and a first drain 332, and the second transistor 340 includes the gate 320, a second source 341, and a second drain 342. In this case, the gate 320 may be the first-direction gate 321 or the second-direction gate 322. For example, when the gate 320 is the first-direction gate 321, the first source 331 of the first transistor 330 is formed on one side of the first-direction gate 321, and the first drain 332 thereof is formed on the other side of the first-direction gate 321. Meanwhile, the second source 341 of the second transistor 340 is formed on the other side of the first-direction gate 321 to face the first drain 332, and the second drain 342 thereof is formed on one side of the first-direction gate 321 to face the first source 331.

In such a case, the first source 331 and the second drain 342 are spaced apart from each other, and the first drain 332 and the second source 341 are spaced apart from each other. The first-direction gate 321 and the second-direction gate 322 included in the gate 320 are branched into two from one part 350, and a plurality of first-direction gates 321 or a plurality of second-direction gates 322 are formed at each branch to supply currents. Since the currents flow in the first-direction gate 321 and the second-direction gate 322 in the opposite direction to each other as illustrated in FIG. 2, the mutual inductance is induced between the first-direction gate 321 and the second-direction gate 322. Accordingly, it is possible to minimize the parasitic inductance components induced between the first-direction gate 321 and the second-direction gate 322 by the mutual inductance.

Meanwhile, the multi-gate transistor 300 includes a plurality of gates 320, the first transistors 320 and the second transistors 340 are formed with the gates 320 interposed therebetween. In this case, gate currents flow in the adjacent gates 320 in the opposite direction. Further, drain-source currents flow in the first transistor 330 and the second transistor 340 in the opposite direction. Accordingly, since the mutual inductances are induced in the sources 331 and 341 or the drains 332 and 342 of the first transistor 330 and the second transistor 340 formed in the gate 320, the parasitic inductances are offset. A detailed description thereof will be described below with reference to FIG. 5.

Figure 5:
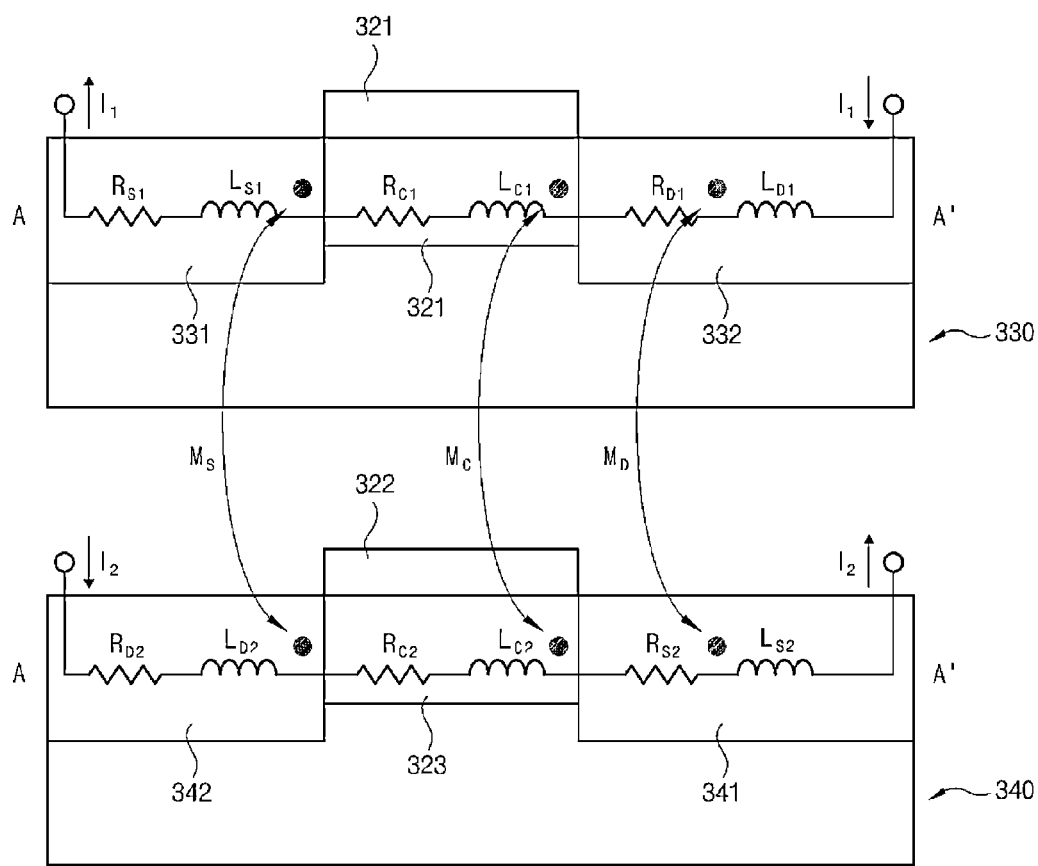
FIG. 5 is a cross-sectional view of the multi-gate transistor of FIG. 4.

FIG. 5 is a cross-sectional view of the multi-gate transistor of FIG. 4.

Referring to FIG. 5, each of the first transistor 330 and the second transistor 340 includes any one first-direction gate 321 or any one second-direction gate 322 among the adjacent gates 320 formed on the substrate 310. When the current is supplied to the multi-gate transistor 300 and the currents are supplied to the sources 331 and 341 and the drains 332 and 342, the sources 331 and 341 of the first transistor 330 and the second transistor 340 may be represented by source resistances $R_{S1}$ and $R_{S2}$ and source parasitic inductances $L_{S1}$ and $L_{S2}$, the channels 321 and 323 may be represented by channel resistances $R_{C1}$ and $R_{C2}$ and channel parasitic inductances $L_{C1}$ and $L_{C2}$, and the drains 332 and 342 may be equalized by drain resistances $R_{D1}$ and $R_{D2}$ and drain parasitic inductances $L_{D1}$ and $L_{D2}$. In this case, since a direction of a source(331)-drain(332) current $I_1$ of the first transistor 330 and a direction of a source(341)-drain(342) current $I_2$ of the second transistor 340 are opposite to each other, the mutual inductances $M_S$, $M_C$ and $M_D$ are induced between the first transistor 330 and the second transistor 340, it is possible to offset the parasitic inductances $L_{S1}$, $L_{S2}$, $L_{C1}$, $L_{C2}$, $L_{D1}$ and $L_{D2}$.

As described above, according to the present invention, in the transistors constituting the multi-gate transistor, the directions of the currents flowing in the adjacent gates are opposite to each other to cause the mutual inductances, so that it is possible to minimize the parasitic inductance components. Further, since the arrangement of the plurality of drains and the arrangement of the plurality of sources constituting the multi-gate transistor are opposite to each other, the directions of the currents flowing in the drain and source are opposite to each other to cause the mutual inductances, it is possible to minimize the parasitic inductance components.

Although the present invention has been described in connection with the preferred embodiments with reference to the drawings, it is not to be restricted by the embodiments. Accordingly, the present invention should be interpreted by the appended claims as including modifications that can be derived from the embodiments.

The invention claimed is:

1. A multi-gate transistor comprising:
    a plurality of gates including a first gate and a second gate, the first and second gates being branched from one port and alternately formed facing to each other, wherein a direction of currents flowing in the first gate is a first direction and direction of currents flowing in the second gate is a second direction, the first direction is an opposite direction to the second direction, wherein
    the first gate and the second gate are formed to share at least one of common source and common drain.

2. The multi-gate transistor of claim 1, wherein the multi-gate transistor includes at least two or more gates that are formed to allow currents to flow in the first direction; and at least two or more other gates that are formed to allow currents to flown in the second direction opposite to the first direction.

3. The multi-gate transistor of claim 2, wherein the gates corresponding to the first direction and the gates corresponding to the second direction are formed to be spaced apart from each other.

4. The multi-gate transistor of claim 2, wherein each of the gates shares at least one of the common source and the common drain.

5. The multi-gate transistor of claim 1, further comprising:
    a first transistor that includes a first source formed on one side of each of the plurality of gates and a first drain formed on the other side thereof; and
    a second transistor that includes a second drain formed on one side of the gate to face the first source and a second source formed on the other side of the gate to face the first drain.

6. The multi-gate transistor of claim 5, wherein a current direction of the first transistor and a current direction of the second transistor are opposite to each other.

7. The multi-gate transistor of claim 5, wherein the first source and the second drain are formed to be spaced apart from each other, and the first drain and the second source are formed to be spaced apart from each other.

8. The multi-gate transistor of claim 1, further comprising:
    a third gate and a fourth gate being branched from the one port, the third gate being symmetrically formed with the first gate, and the fourth gate being symmetrically formed with the second gate, wherein
    a direction of the currents flowing in the first gate and the third gate is the first direction and a direction of the currents flowing in the second gate and the fourth gate is the second direction.

9. The multi-gate transistor of claim 1, wherein a source of the first gate is formed on a first portion of the first gate, and a drain of the first gate is formed on the second portion of the first gate, and wherein a drain of the second gate is formed on a first portion of the second gate and a source of the second gate is formed on a second portion of the second gate, and wherein the first gate and the second gate is formed to share the common drain.

10. The multi-gate transistor of claim 1, wherein
    each gate of the plurality of gates is formed to allow current to flow either the first direction or the second direction only so that an opposite direction current cannot be flown in the respective one of the plurality of gates.

* * * * *